United States Patent [19]

Koken

[11] Patent Number: 4,682,099
[45] Date of Patent: Jul. 21, 1987

[54] LOGARITHMIC POTENTIOMETER CIRCUIT

[75] Inventor: Claus Koken, Hamburg, Fed. Rep. of Germany

[73] Assignee: U.S. Philips Corporation, New York, N.Y.

[21] Appl. No.: 716,771

[22] Filed: Mar. 27, 1985

[30] Foreign Application Priority Data

Apr. 4, 1984 [DE] Fed. Rep. of Germany ....... 3412532

[51] Int. Cl.$^4$ ............................................. G01R 27/02
[52] U.S. Cl. ........................................ 324/63; 338/89
[58] Field of Search ..................... 324/63, 62, DIG. 1; 318/663; 338/89; 307/492; 330/104, 256; 333/216, 213, 217; 328/105

[56] References Cited

U.S. PATENT DOCUMENTS 4,023,094 5/1977 Adams .............................. 324/63 X
4,151,478 4/1979 Heinrich et al. ................ 330/103 X

FOREIGN PATENT DOCUMENTS 1497418 1/1978 United Kingdom .

OTHER PUBLICATIONS

Sedra et al., Micro-Electronics Circuits, 1982, pp. 84–86.

Primary Examiner—Reinhard J. Eisenzopf
Assistant Examiner—Jack B. Harvey
Attorney, Agent, or Firm—Robert T. Mayer; Bernard Franzblau

[57] ABSTRACT

An inexpensive potentiometer circuit having an approximately logarithmic characteristic that can be accurately determined is obtained if a resistance element having a linearly adjustable ohmic resistance value is connected parallel to a negative impedance converter (1) having an output port connected to a fixed ohmic resistor (8).

10 Claims, 2 Drawing Figures

LOGARITHMIC POTENTIOMETER CIRCUIT

BACKGROUND OF THE INVENTION

This invention relates to a logarithmic potentiometer circuit comprising an adjustable ohmic resistance element.

Logarithmic potentiometers are well known and are described, for example, in "Baiers Electronik Lexikon", Francksche Verlagsbuchhandlung, Stuttgart, 1974, p. 406. If a connection terminal and the tapping on a logarithmic potentiometer are electrically interconnected, an adjustable ohmic resistance element is obtained having an exponential resistance characteristic, which can be represented as a straight line when the ohmic resistance is plotted logarithmically on the ordinate of the characteristic diagram. Such potentiometers can be constructed as film potentiometers or as wire potentiometers. The manufacture of logarithmic wire potentiometers having an exponential characteristic that can be accurately determined is comparatively expensive, however, because in this case high-resistance wire is wound onto a starting body that is insulating and is manufactured precisely. Also, film potentiometers whose actual characteristic fully corresponds to a determined characteristic can be manufactured only with great technical efforts.

An object of the present invention is to provide an inexpensive potentiometer circuit having an approximately logarithmic characteristic that can be accurately determined.

SUMMARY OF THE INVENTION

A logarithmic potentiometer circuit of the kind mentioned in the opening paragraph achieves this object in that the resistance element has a linearly adjustable ohmic resistance value and is connected parallel to a bipolar circuit arrangement having a negative ohmic resistance value.

The potentiometer circuit according to the invention consists solely of a linearly adjustable resistance element, which can be manufactured at a comparatively low cost, and a simple bipolar circuit arrangement having a negative ohmic resistance value and constructed, for example, as an amplifier whose characteristic can be accurately determined via the passive and active elements contained in the amplifier. A negative ohmic resistance value can then be measured at the input terminals of the circuit arrangement so that the resistance of the parallel combination of the adjustable resistance element and the bipolar circuit arrangement varies approximately exponentially when the resistance element is readjusted.

An advantageous embodiment of the invention is characterized in that the circuit arrangement is constructed as a negative impedance converter having an input terminal connected to a connection terminal of the resistance element and an output terminal connected through a fixed ohmic resistor to the other connection terminal of the resistance element. Negative impedance converters (cf. Tietze, Schenk:Halbleiter-Schaltungstechnik; Fourth edition; 1978, Springer Verlag; p. 255 to 258) are constructed in a simple manner so that they can be manufactured at comparatively low cost.

BRIEF DESCRIPTION OF THE DRAWING

An embodiment of the invention will be described hereinafter with reference to the drawings. In the drawings.

DESCRIPTION OF THE PREFERRED EMBODIMENT

Figure 1:
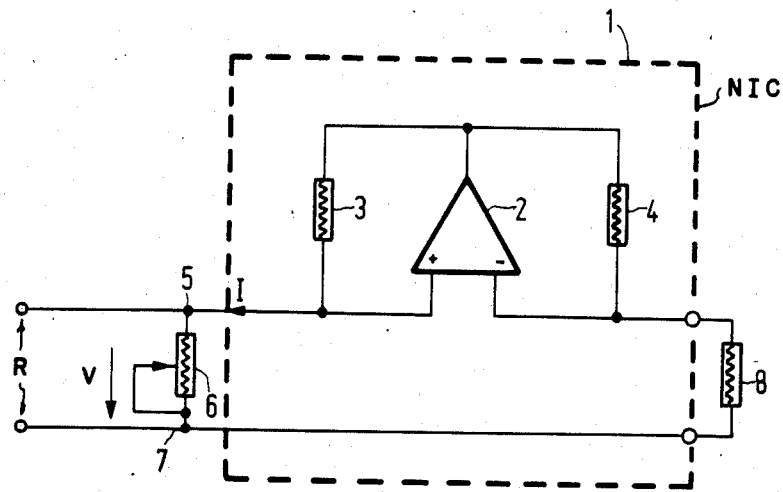
FIG. 1 shows a logarithmic potentiometer circuit comprising a negative impedance converter.

An amplifier constructed as a negative impedance converter 1 is shown in FIG. 1 in dotted lines and consists of an operational amplifier 2 having its output connected through a first resistor 3 to the non-inverting input and through a second resistor 4 to the inverting input of the operational amplifier 2.

Moreover, the non-inverting input of the operational amplifier 2 is connected to a connection terminal 5 of a resistance element 6 having a linearly adjustable ohmic resistance. The other connection terminal 7 is connected through a fixed ohmic resistor 8 to the inverting input of the operational amplifier 2.

If a voltage U is applied to the terminals 5 and 7, a current I flows in the negative impedance converter 1 in the direction of the indicated arrow. The resistance R1 of the negative impedance converter 1 is consequently negative and follows from the relation $R1 = -R8 \times R3/R4$. R3 represents the resistance value of the first resistor 3, R4 represents the value of the second resistor 4 and R8 represents the value of the fixed ohmic resistor 8.

The resistance value R of the parallel-combination of the negative impedance converter 1 and the resistance element 6 that can be measured at the terminals 5 and 7 is obtained according to the relation $R = R1 \times R6/(R1 - R6)$, where R6 represents the value of the resistance element 6.

Figure 2:
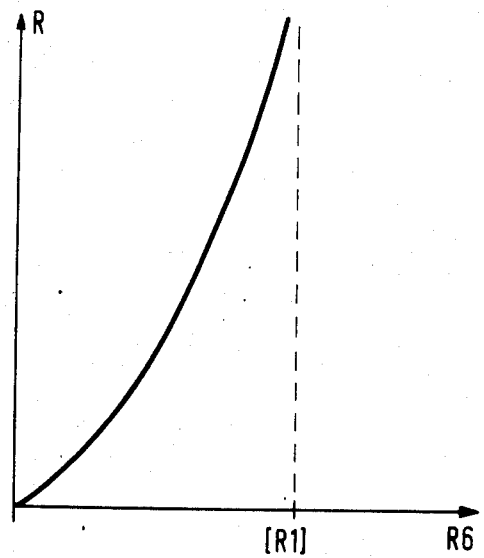
FIG. 2 shows the characteristic of the potentiometer circuit.

The manner in which according to this relation the resistance value R of the potentiometer circuit varies in dependence upon the resistance value R6 of the resistance element 6 is shown in FIG. 2. It is apparent therefrom that with a linear increase of the resistance value R6 the ohmic resistance R of the pentiometer circuit increases approximately exponentially. Moreover, the resistance R6 has to be smaller than the value R1 following from the quotient of voltage U to current I because the resistance R of the potentiometer circuit becomes infinitely large if the resistance R6 of the resistance element 6 assumes the value R1.

A tested potentiometer circuit comprises an operational amplifier 2 of the type TL072ACP-00 of Texas Instruments, a first resistor 3 of 8.94 kΩ, a second resistor 4 of 5.11 kΩ, a fixed ohmic resistor 8 of 10 kΩ and a resistance element 6 whose resistance value is linearly adjustable from 4 kΩ to 14 kΩ. At the input terminals 5 and 7, this potentiometer circuit has an ohmic resistance which can be varied from about 5 kΩ to about 70 kΩ.

What is claimed is:

1. A logarithmic potentiometer circuit comprising, an adjustable ohmic resistance element having a linearly adjustable ohmic resistance characteristic, means connecting said linearly adjustable ohmic resistance element in parallel with a bipolar circuit arrangement having a negative ohmic resistance value, and means connecting the parallel combination of the linearly adjustable resistance element and the negative resistance bipolar circuit to a pair of terminals at which an approximately logarithmic resistance characteristic is derived.

2. A logarithmic potentiometer circuit as claimed in claim 1, characterized in that the bipolar circuit arrangement comprises a negative impedance converter having an input terminal connected to a connection terminal of the adjustable resistance element and having an output terminal connected through a fixed ohmic resistor to the other connection terminal of the adjustable resistance element.

3. A logarithmic potentiometer circuit as claimed in claim 1 wherein the bipolar circuit arrangement comprises first and second terminals connected to the terminals of the linearly adjustable resistance element and third and fourth terminals connected to the terminals of a resistor.

4. A logarithmic potentiometer circuit as claimed in claim 3 wherein the bipolar circuit arrangement further comprises, an operational amplifier having a non-inverting input connected to said first terminal and an inverting input connected to said third terminal, said operational amplifier having an output connected via second and third resistors to the non-inverting input and the inverting input, respectively, and means connecting said second terminal to said fourth terminal.

5. A logarithmic potentiometer circuit as claimed in claim 4 wherein said first, second and third resistors have resistance values of R8, R3 and R4, respectively, whereby said bipolar circuit arrangement exhibits a resistance value R1 at said first and second terminals having the following relationship, $R1 = -R8 \times R3/R4$.

6. A logarithmic potentiometer circuit as claimed in claim 5 wherein the parallel combination of the bipolar circuit arrangement and the adjustable resistance element produces a resistance R at said first and second input terminals in accordance with the following relationship, $R = R1 \times R6/(R1 - R6)$, where R6 is the resistance of the adjustable resistance element.

7. A logarithmic potentiometer circuit as claimed in claim 6 wherein the resistance R6 is at all times less than the resistance R1.

8. A logarithmic potentiometer circuit as claimed in claim 1 wherein the bipolar circuit arraangement comprises a negative impedance converter with input terminals connected to said linearly adjustable resistance element so as to form the parallel combination of adjustable resistance element and negative resistance bipolar circuit, said negative impedance converter having a negative input resistance R1, and wherein said parallel combination produces a resistance R at said input terminals having the following relationship, $R = R1 \times R6/(R1 - R6)$, where R6 is the resistance of the adjustable resistance element.

9. A potentiometer circuit having an approximately exponential characteristic comprising, first and second terminals for deriving an approximately exponential resistance characteristic, a manually adjustable resistance element having a linearly variable resistance, means connecting said adjustable resistance element to said first and second terminals, and a bipolar circuit having a negative resistance connected to said first and second terminals so that the adjustable resistance element and the bipolar circuit are connected in parallel, manual adjustment of the linearly adjustable resistance element producing an approximately exponential resistance variation at said first and second terminals.

10. A potentiometer circuit as claimed in claim 9 wherein said bipolar circuit comprises a negative impedance converter having first and second input terminals connected to said first and second terminals, respectively, and a second pair of terminals connected to a fixed resistor.

* * * * *